（12）United States Patent
Jiang et al.

(10) Patent No.: US 10,720,413 B2
(45) Date of Patent: Jul. 21, 2020

(54) LED PACKAGE, LED MODULE AND METHOD FOR MANUFACTURING LED PACKAGE

(71) Applicant: Hangzhou Multi-Color Optoelectronics Co., Ltd, Zhejiang (CN)

(72) Inventors: Zhongyong Jiang, Zhejiang (CN); Wenyue Fu, Zhejiang (CN)

(73) Assignee: HANGZHOU MULTI-COLOR OPTOELECTRONICS CO., LTD., Zhejiang (CN)

( * ) Notice: Subject to any disclaimer, the term of this patent is extended or adjusted under 35 U.S.C. 154(b) by 25 days.

(21) Appl. No.: 15/743,828

(22) PCT Filed: Jul. 6, 2017

(86) PCT No.: PCT/CN2017/092099
§ 371 (c)(1),
(2) Date: Jan. 11, 2018

(87) PCT Pub. No.: WO2018/095043
PCT Pub. Date: May 31, 2018

(65) Prior Publication Data
US 2019/0006326 A1    Jan. 3, 2019

(30) Foreign Application Priority Data

Nov. 25, 2016  (CN) .......................... 2016 1 1057826

(51) Int. Cl.
*H01L 25/075* (2006.01)
*H01L 25/16* (2006.01)
(Continued)

(52) U.S. Cl.
CPC .......... *H01L 25/0753* (2013.01); *H01L 21/50* (2013.01); *H01L 25/167* (2013.01);
(Continued)

(58) Field of Classification Search
CPC . H01L 2224/48091; H01L 2224/48247; H01L 2924/00014; H01L 21/50; H01L 25/0753; H01L 25/167; H01L 33/52
See application file for complete search history.

(56) References Cited

U.S. PATENT DOCUMENTS

| 4,445,132 A * | 4/1984 | Ichikawa ................. G09F 9/33 257/13 |
| 2013/0208026 A1* | 8/2013 | Suzuki .................... H01L 33/36 345/690 |

(Continued)

FOREIGN PATENT DOCUMENTS

| CN | 203607453 U | 5/2014 |
| CN | 106531730 A | 3/2017 |

*Primary Examiner* — Bilkis Jahan
*Assistant Examiner* — Victor V Barzykin
(74) *Attorney, Agent, or Firm* — Westman, Champlin & Koehler, P.A.

(57) ABSTRACT

Disclosed is an LED package, an LED module and a method for manufacturing the LED package. The LED package includes a lead frame comprising an insulating substrate and a plurality of first pins to a plurality of fourth pins formed on the insulating substrate, a plurality of first bonding pads to a plurality of fourth bonding pads, and a plurality of first wires to a plurality of fourth wires; a plurality of pixel units, each of which includes a first LED element, a second LED element and a third LED element; and an encapsulating composition covering the lead frame and allowing light to transmit. The LED package includes the plurality of LED elements of pixel units and implements internal interconnection with additional wires, thereby reducing the number of bonding pads of the LED package, and thus the manufacturing cost is reduced and the product reliability is improved.

19 Claims, 6 Drawing Sheets

(51) Int. Cl.
*H01L 33/52* (2010.01)
*H01L 21/50* (2006.01)
*H01L 33/62* (2010.01)
*H01L 33/48* (2010.01)

(52) U.S. Cl.
CPC ............ *H01L 33/52* (2013.01); *H01L 33/486* (2013.01); *H01L 33/62* (2013.01); *H01L 2224/49113* (2013.01); *H01L 2224/97* (2013.01); *H01L 2933/005* (2013.01); *H01L 2933/0033* (2013.01); *H01L 2933/0066* (2013.01)

(56) References Cited

U.S. PATENT DOCUMENTS

2017/0009971 A1* 1/2017 Chan .................... H01L 25/0753
2018/0358522 A1* 12/2018 Schwarz ............. H01L 25/0753

* cited by examiner

- Prior Art -

LED PACKAGE, LED MODULE AND METHOD FOR MANUFACTURING LED PACKAGE

CROSS-REFERENCE TO RELATED APPLICATION

This Application is a Section 371 National Stage Application of International Application No. PCT/CN2017/092099, filed Jul. 6, 2017, and claims priority to the Chinese Patent Application No. 201611057826.7, filed on Nov. 25, 2016, entitled "LED package, LED module and method for manufacturing LED package", which are incorporated herein by reference in their entirety.

BACKGROUND OF THE DISCLOSURE

Field of the Disclosure

The present disclosure relates to LED display technology, and more particularly, to an LED package for an LED display screen, an LED module and a method for the LED package.

Background of the Disclosure

An LED display screen has following advantages: high gray scale, wide view angle, rich colors and customizable screen shape. Therefore, the LED display screen is widely used in various fields of industry, transportation, commercial advertisement, information dissemination, sport games and so on.

In the LED display screen, light emitting diodes (LEDs) are used as pixel components. The pixel component is for example, an LED package packaged in a manner same with that of a Surface Mounted Devices (SMD). Each LED package may include a lead frame, three LED elements mounted on the lead frame for respectively showing red, green, and blue colors and a resin encapsulating composition which covers the lead frame and allows light to transmit. The respective light emitting sides of the three LED elements are covered by the encapsulating composition. When an image is displayed, the luminance of the three LED elements in each LED package is controlled so that full color light emitting can be implemented by mixing colors.

In the above LED package, LEDs are mounted on the lead frame, and then covered by the encapsulating composition. Each LED package forms a respective pixel unit, and includes four bonding pads. When an LED module is formed, a plurality of LED packages are welded to a printed circuit board (PCB). The LED module requires a lot of work of placement and welding, which result in low production efficiency and high cost. Due to the difficulty in welding small-size bonding pads, the reliability of the LED module is reduced.

Therefore, it is desired to further improve the structure and manufacturing method of the LED module, to reduce the manufacturing cost of the LED module and improve the product reliability.

SUMMARY OF THE DISCLOSURE

In view of the above, one objective of the disclosure is to provide an improved LED package, LED module and a method for manufacturing the LED package. The LED package includes a plurality of LED elements and has fewer bonding pads, so that the manufacturing cost is reduced and the production reliability is improved.

According to a first aspect of the disclosure, there is provided an LED package, comprising:

a lead frame comprising an insulating substrate, a plurality of first pins to a plurality of fourth pins formed on the insulating substrate, a plurality of first bonding pads to a fourth bonding pads and a plurality of first wires to a plurality of fourth wires;

a plurality of pixel units, each of which includes a first LED element, a second LED element and a third LED element;

and an encapsulating composition covering the lead frame and allowing light to transmit, wherein, in each pixel unit, the first LED element, the second LED element and the third LED element respectively have a first electrode being fixed on a common one of the plurality of first pins, and a second electrode of the first LED element, a second electrode of the second LED element and a second electrode of the third LED element are respectively fixed on a corresponding one of the plurality of second pins, a corresponding one of the plurality of third pins and a corresponding one of the plurality of fourth pins, each of the plurality of first wires is used for connecting corresponding ones of the plurality of first pins of the plurality of pixel units with each other, and connecting the corresponding first pins to a corresponding one of the plurality of first bonding pads, each of the plurality of second wires is used for connecting corresponding ones of the plurality of second pins of the plurality of pixel units with each other, and connecting the corresponding second pins to a corresponding one of the plurality of second bonding pads, each of the plurality of third wires is used for connecting corresponding ones of the plurality of third pins of the plurality of pixel units with each other, and connecting the corresponding third pins to a corresponding one of the plurality of third bonding pads, each of the plurality of fourth wires is used for connecting corresponding ones of the plurality of fourth pins of the plurality of pixel units with each other, and connecting the corresponding fourth pins to a corresponding one of the plurality of fourth bonding pads.

Preferably, the insulating substrate comprises a first surface and a second surface being opposed to each other, the plurality of first pins to the plurality of fourth pins and the plurality of first wires are provided on the first surface, the plurality of the first bonding pads to the plurality of fourth bonding pads and the plurality of second wires to the plurality of fourth wires are provided on the second surface, and the LED package further comprises a plurality of vias passing through the insulating substrate to provide an electrical connection of the first surface to the second surface.

Preferably, the plurality of pixel units are arranged in a pixel array, the plurality of first wires are respectively used for interconnecting a plurality of first pins of a plurality of pixel units in a same column, the plurality of second wires are respectively used for interconnecting a plurality of second pins of a plurality of pixel units in a same row, the plurality of third wires are respectively used for interconnecting a plurality of third pins of a plurality of pixel units in a same row, and the fourth wires are respectively used for interconnecting a plurality of fourth pins of a plurality of pixel units in a same row.

Preferably, the first electrode is one of anode and cathode electrodes, and the second electrode is the other of anode and cathode electrodes.

Preferably, the first LED element, the second LED element and the third LED element show red, green and blue colors, respectively and their arrangement order is not limited.

Preferably, the LED package further comprises: a plurality of bonding wires, wherein the first LED element, the second LED element and the third LED element are connected to a corresponding one of the plurality of pins through corresponding ones of the plurality of bonding wires, respectively.

Preferably, light emitting sides of the first LED element, the second LED element and the third LED element are covered by the encapsulating composition, respectively.

Preferably, the first LED element is fixed on the pin by a conductive adhesive.

Preferably, the lead frame is formed by a printed circuit board process, the insulating substrate is a substrate of the printed circuit board, the plurality of first pins to the plurality of fourth pins, the plurality of first bonding pads to the plurality of fourth bonding pads, and the plurality of first wires to the plurality of fourth wires are respectively formed by applying pattern transfer and etching method on a metal layer of the printed circuit board.

According to a second aspect of the disclosure, there is provided an LED module, comprising:

a printed circuit board comprising a second insulating substrate and a plurality of fifth bonding pads and a plurality of fifth wires on the second insulating substrate;

a control chip being fixed and electrically connected with a corresponding bonding pad of the plurality of fifth bonding pads; and at least one LED package being fixed and electrically connected with a corresponding bonding pad of the plurality of fifth bonding pads, wherein the plurality of fifth wires are used for electrically connecting the control chip with the at least one LED package, the at least one LED package respectively comprises:

a lead frame comprising a first insulating substrate, and a plurality of first pins to a plurality of fourth pins, a plurality of first bonding pads to a plurality of fourth bonding pads, and a plurality of first wires to a plurality of fourth wires formed on the first insulating substrate;

a plurality of pixel units, each of which comprises a first LED element, a second LED element and a third LED element; and an encapsulating composition covering the lead frame and allowing light to transmit, wherein, in each pixel unit, the first LED element, the second LED element and the third LED element respectively have a first electrode being fixed on a common one of the plurality of first pins, and a second electrode of said first LED element, a second electrode of said second LED element and a second electrode of said third LED element are respectively fixed on a corresponding one of the plurality of second pins, a corresponding one of said plurality of third pins and a corresponding one of the plurality of the fourth pins, each of the plurality of first wires is used for connecting corresponding ones of the plurality of first pins of the plurality of pixel units with each other, and connecting the corresponding first pins to a corresponding one of the plurality of first bonding pads, each of the plurality of second wires is used for connecting corresponding ones of the plurality of second pins of the plurality of pixel units with each other, and connecting the corresponding second pins to a corresponding one of the plurality of second bonding pads, each of the plurality of third wires is used for connecting corresponding ones of the plurality of third pins of the plurality of pixel units with each other, and connecting the corresponding third pins to a corresponding one of the plurality of third bonding pads, each of the plurality of fourth wires is used for connecting corresponding ones of the plurality of fourth pins of the plurality of pixel units with each other, and connecting the corresponding fourth pins to a corresponding one of the plurality of fourth bonding pads.

Preferably, the first insulating substrate comprises a first surface and a second surface being opposed to each other, the plurality of first pins to the plurality of fourth pins and the plurality of first wires are provided on the first surface, the plurality of the first bonding pads to the plurality of fourth bonding pads and the plurality of second wires to the plurality of fourth wires are provided on the second surface, and the LED package further comprises a plurality of vias passing through the insulating substrate to provide an electrical connection of the first surface to the second surface.

Preferably, the control chip comprises at least one selected from a group consisting of a display driver circuit and a power supply circuit.

According to a third aspect of the disclosure, there is provided a method for manufacturing an LED package, comprising:

forming a lead frame for defining a plurality of first pins to a plurality of fourth pins, a plurality of first bonding pads to a fourth bonding pads, and a plurality of first wires to a fourth wires therein;

fixing a plurality of LED elements on the lead frame, wherein the plurality of LED elements constitute a plurality of pixel units, each pixel unit comprises a first LED element, a second LED element and a third LED element of the plurality of LED elements;

connecting the plurality of LED elements to the plurality of first pins to the plurality of fourth pins using bonding wires;

conducting molding to form an encapsulating composition on the lead frame;

cutting and separating to form an LED package;

fixing a plurality of LED packages on a printed circuit board; and fixing a control chip on the printed circuit board, wherein, in the pixel unit, the first LED element, the second LED element and the third LED element respectively have a first electrode being fixed on a common one of the plurality of first pins, and a second electrode of said first LED element, a second electrode of said second LED element and a second electrode of said third LED element are respectively fixed on a corresponding one of the plurality of second pins, a corresponding one of the plurality of third pins and a corresponding one of the plurality of the fourth pins, each of the plurality of first wires is used for connecting corresponding ones of the plurality of first pins of the plurality of pixel units with each other, and connecting the corresponding first pins to a corresponding one of the plurality of first bonding pads, each of the plurality of second wires is used for connecting corresponding ones of the plurality of second pins of the plurality of pixel units with each other, and connecting the corresponding second pins to a corresponding one of the plurality of second bonding pads, each of the plurality of third wires is used for connecting corresponding ones of the plurality of third pins of the plurality of pixel units with each other, and connecting the corresponding third pins to a corresponding one of the plurality of third bonding pads, each of the plurality of fourth wires is used for connecting corresponding ones of the plurality of fourth pins of the plurality of pixel units with each other, and connecting the corresponding fourth pins to a corresponding one of the plurality of fourth bonding pads.

Preferably, the step of forming a lead frame comprises:

forming a plurality of vias at positions of the plurality of first wires to the plurality of fourth wires on an insulating substrate of the printed circuit board by a PCB manufacturing process;

forming the plurality of first pins to the plurality of fourth pins and the plurality of first wires on a first surface of the insulating substrate of the printed circuit board; and forming the plurality of first bonding pads to the plurality of fourth bonding pads and the plurality of second wires to the plurality of fourth wires on a second surface of the insulating substrate of the printed circuit board.

Preferably, the step of forming a lead frame comprises:

punching a sheet of metal material for defining the plurality of first pins to the plurality of fourth pins, the plurality of first bonding pads to the plurality of fourth bonding pads, and shape of the plurality of first wires to shape of the plurality of fourth wires; and punching and cutting to cut off connection between the lead frame and a support frame.

Preferably, between the step of forming a lead frame and the step of fixing a plurality of LED elements on the lead frame, further comprising:

forming a metal plating layer on the plurality of first pins to the plurality of fourth pins, to improve electrical conductivity and solder wettability.

Preferably, the step of fixing a plurality of LED elements on the lead frame comprises:

the non-light-emitting sides of the plurality of LED elements are fixed on the plurality of first pins to the plurality of fourth pins in the lead frame.

Preferably, the step of fixing a plurality of LED elements on the lead frame comprises:

bonding at least a first element of the plurality of elements by conductive adhesive.

Preferably, the step of form an encapsulating composition on the lead frame comprises:

placing the lead frame in a mold, and injecting the encapsulating composition towards a surface of the lead frame from the light emitting sides of the plurality of LED elements.

In the above LED package, the LED elements are mounted on the lead frame, and then covered by the encapsulating composition. Each LED package includes a plurality of pixel units and implements interconnection by multiple sets of wires, and then the multiple sets of wires are connected to the corresponding bonding pads. When an LED module is formed, a plurality of LED packages are welded to a printed circuit board (PCB). The LED package improves the integration level of the pixel units and reduces the total number of the bonding pads. When the LED module is formed, the work of placing and welding the LED packages is reduced, so that the production efficiency is improved and the manufacturing cost is reduced. Because the LED package requires a decreased number of bonding pads, large-size bonding pads can be used therein, to decrease the difficulty in welding the bonding pads, and thus, the reliability of the LED module is improved.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Figure 1:
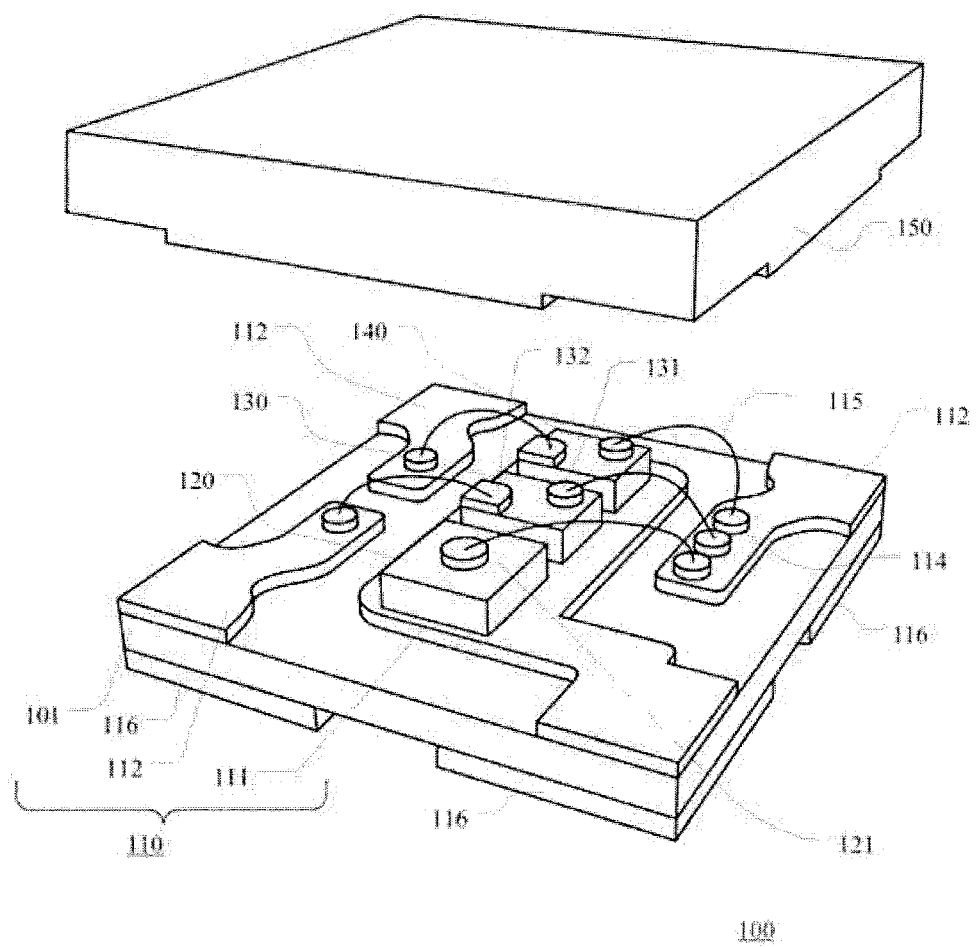
FIG. 1 is an exploded perspective diagram of an LED package in the prior art.

Exemplary embodiments of the present disclosure will be described in more details below with reference to the accompanying drawings. In the drawings, like reference numerals denote like members. The figures are not drawn to scale, for the sake of clarity. The disclosure can be embodied in various forms, some of which will be described below.

FIG. 1 is an exploded perspective diagram of an LED package in the prior art. An LED package 100 includes a lead frame 110, LED elements 120 to 140, and an encapsulating composition 150, wherein the LED elements 120 to 140 are mounted on the lead frame 110, the encapsulating composition 150 is a type of light-transmissive material, covering a surface of the lead frame 110. In FIGs, for the sake of clarity, the encapsulating composition 150 of the package 100 is separated from the other portions.

The lead frame 110 is a double-layer circuit board manufactured by a PCB manufacturing process, including a PCB substrate 101 and a plurality of bonding pads 116, a pin 111 (or referred to as a solid crystal area) and a plurality of pins 112. The plurality of pins 112 and the pin 111 are provided on a same side of the PCB substrate 101, and are respectively opposite to the plurality of bonding pads provided on the other side of the PCB substrate 101, and the plurality of pins 112 and the pin 111 are electrically connected to corresponding ones of the plurality of bonding pads 116 through the vias on the PCB substrate 101, respectively. The pin 111 is used to provide mechanical support for the LED elements 120 to 140. Because the pin 111 itself is also conductive, the pin 111 also serves as a pin for electrical connection to the LED element 120 and extends to the corner of the PCB substrate for electrically connecting with a corresponding bonding pad 116 on the other side of the PCB substrate through the vias, so that electrical connection between the LED element 120 and external circuits are realized. The plurality of pins 112 are separated from each other, for electrically connecting the LED elements 120 to 140, and respectively extends to the corner of the PCB substrate, for electrically connecting a corresponding bonding pad 116 on the other side of the PCB substrate through the vias, so that electrical connection between the LED elements 120 to 140 and external circuits are realized. Moreover, at least one pin of the plurality of pins 112 are connected to the LED elements 120 to 140 at a same time, to provide electrical interconnection between the LED elements 120 to 140.

The lead frame 110 may be manufactured by a PCB manufacturing process, for example, pattern transfer and etching method are applied to limit the pins and the shape of the pins. The pin 111 and the plurality of pins 112 may further include additional plating layer to improve the electrical conductivity, for example, conductive plating layers are formed on the pin 111 and a plurality of pins 112 by using materials selected from the group consisting of gold, silver and other precious metals. Further, the lead frame 110 may include an internal bonding pad 114 which holds solder for conveniently electrically connecting with the LED elements.

The LED elements 120 to 140 are light emitting elements respectively showing one of red, green and blue colors. The LED elements 120 to 140 respectively include an anode and a cathode, and includes a PN junction inside. When a forward voltage is applied between the anode and the cathode of an LED element, the LED element is turned on, electrons are injected from N-type region into P-type region, and holes enter the N-type region from the P-type region, so that the combination of the minority carriers and the majority carriers is used to emit light. The LED elements 120 to 140 may be fixed on a bearing region of the lead frame 110 by using an adhesive.

According to the characteristics of the internal structure, the anode and cathode electrodes of the LED elements 120 to 140 may be formed on a same surface or opposite surfaces of an LED element. For example, FIG. 1 illustrates an LED element 120 which has a vertical structure and shows red color, the anode 121 and the cathode (not shown) are respectively formed on opposite surfaces. In the prior art, the anode 121 of the LED element 120 is provided on an upper surface of the LED element 120. The LED elements 130 and 140 both have a planar structure and respectively show blue and green colors. For example, the anode 131 and the cathode 132 of the LED element 130 are provided on the upper surface of the LED element 130 and are separated from each other.

The LED element 120 is fixed on the pins of the lead frame 110 by using a conductive adhesive (e.g., silver glue) and meanwhile the cathode of the LED element 120 is electrically connected to the pin 111. By using the bonding wires 115, the cathodes of the LED elements 130 and 140 are connected to a corresponding one of the plurality of pins 112 and the anodes of the LED elements 120 to 140 are connected to a common pin of the plurality of pins 112.

The encapsulating composition 150 allows the light generated by the LED elements 120 to 140 to transmit and the material of the encapsulating composition 150 is, for example, an epoxy resin.

The bonding pad 116 is used for electrical connection with external circuits. For example, the bonding pad 116 of the LED package may be fixed on the printed circuit board by using solder and further connect to a display driver circuit via the printed circuit board.

In operation, the display drive circuit provides driving signals to the LED elements 120 to 140 of the LED package 150, and light emission with the desired colors and luminance can be generated by controlling the luminance of various LED elements. After the LED package is used as a pixel unit to form an LED display screen, the LED display screen can be controlled by a driver circuit to display images.

In the above-described conventional LED package, the pin 111 is not only used for providing mechanical support to the LED elements 120 to 140, but also used as a pin itself, which extends from the lower side of the LED element to the corner of the PCB substrate 101 and electrically connects with a corresponding bonding pad 116 on the other side of the PCB substrate through the vias.

Moreover, the plurality of pins 112 respectively include a first portion for electrically connecting with the LED elements 120 to 140, a second portion for electrically connecting the bonding pad 116 through the vias, and an intermediate portion extending between the first portion and the second portion. The first portion of the plurality of pins 112 is used for providing interconnection region to electrically connect with the bonding wires 115. In the embodiment shown by FIG. 1, the first portion of the plurality of pins 112 is striped in shape.

In the above LED package, the LED elements 120 to 140 are mounted on the lead frame 110, and then covered by the encapsulating composition. Each LED package forms a respective pixel unit, and includes four bonding pads 116. When an LED module is formed, a plurality of LED packages are welded to a printed circuit board (PCB). For example, in order to form an LED module including 9*6 pixel units, the total number of the bonding pads is 9*6*4, i.e., 216. The LED module requires a lot of work of placing and welding the LED packages, which result in low production efficiency and high cost. In the application of small pitch LED display screen, the pitch of the pixel units is, for example, less than 1.6 mm, and the size is for example, less than 1*1 mm. The size of the bonding pad of the LED package is for example, 0.3*0.3 mm. Due to the difficulty in welding small-size bonding pads, the reliability of the LED module is reduced.

Figure 2:
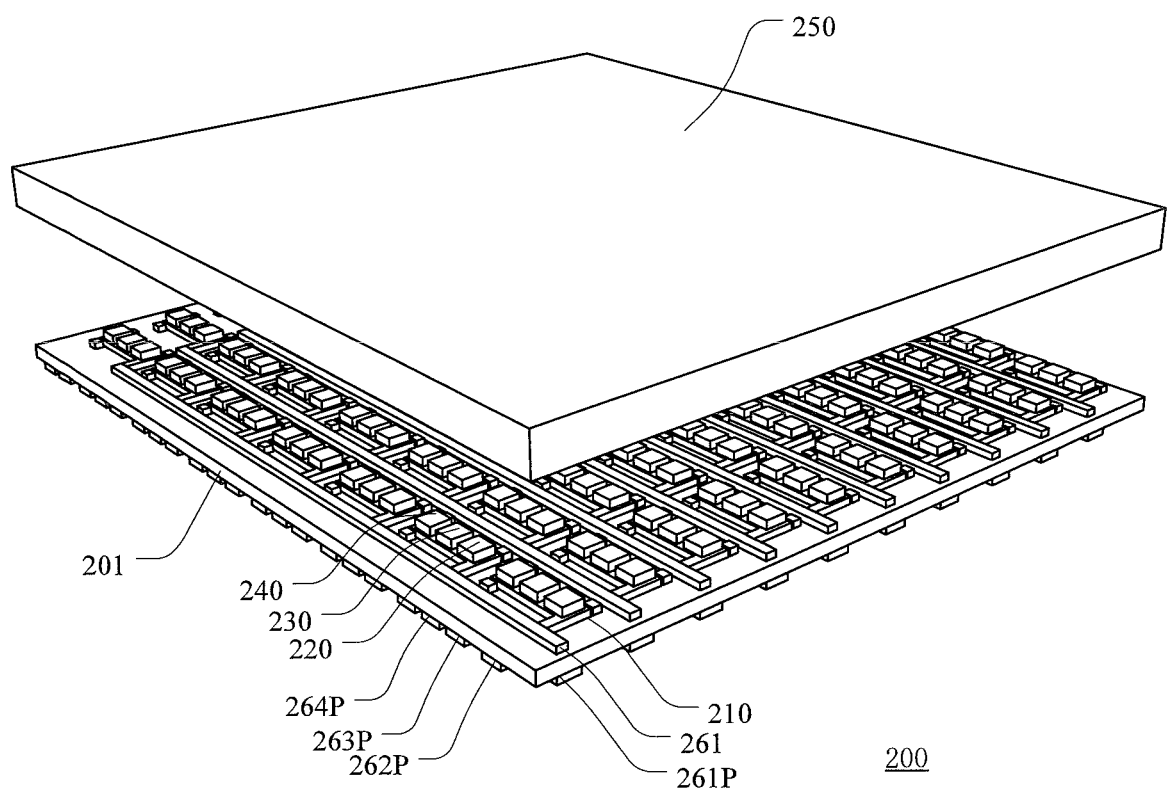
FIG. 2 is an exploded perspective diagram of an LED package according to an embodiment of the present disclosure.
Figure 3A:
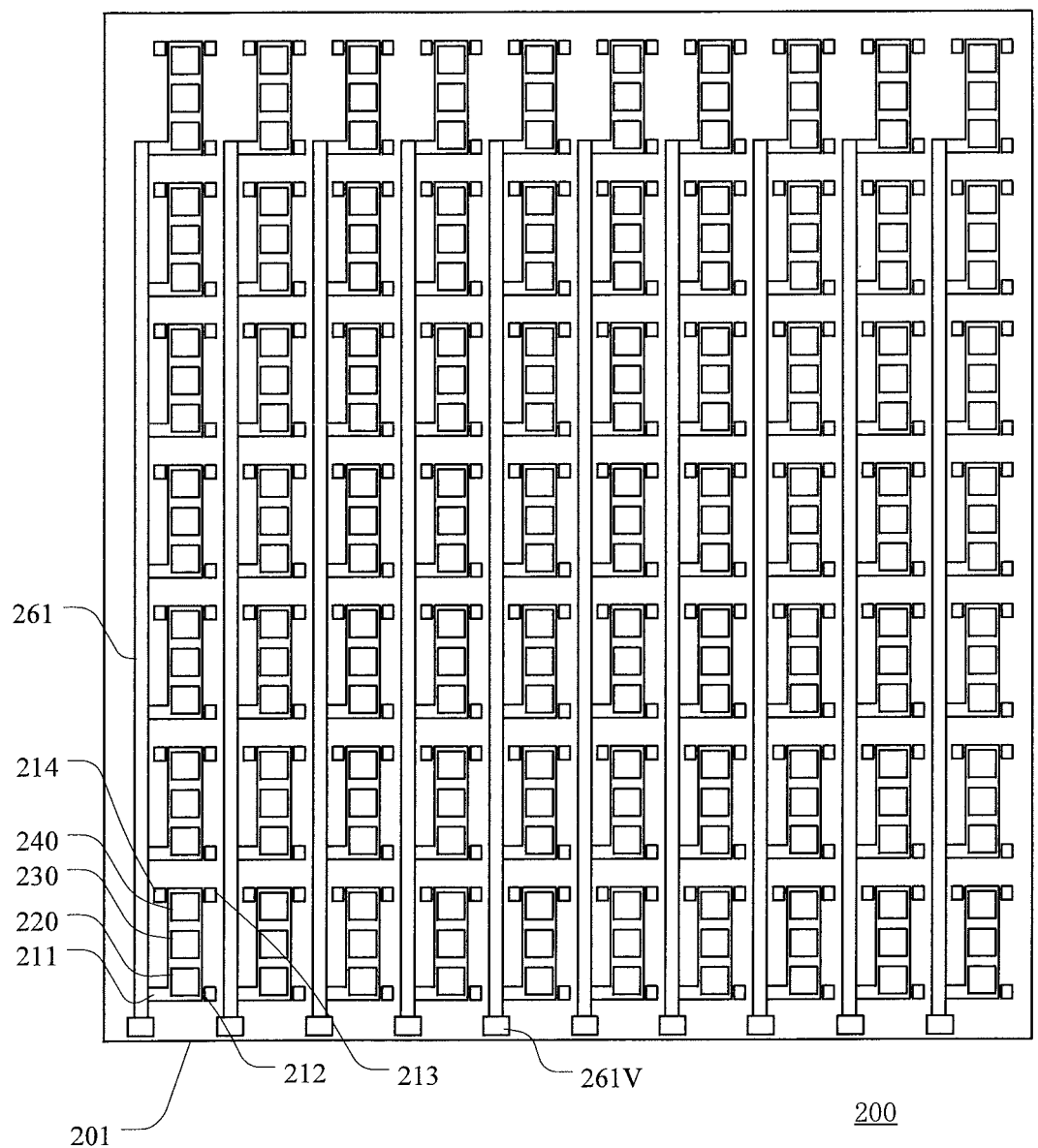
FIGS. 3a and 3b are a top view and a bottom view of an LED package according to an embodiment of the present disclosure.
Figure 3B:
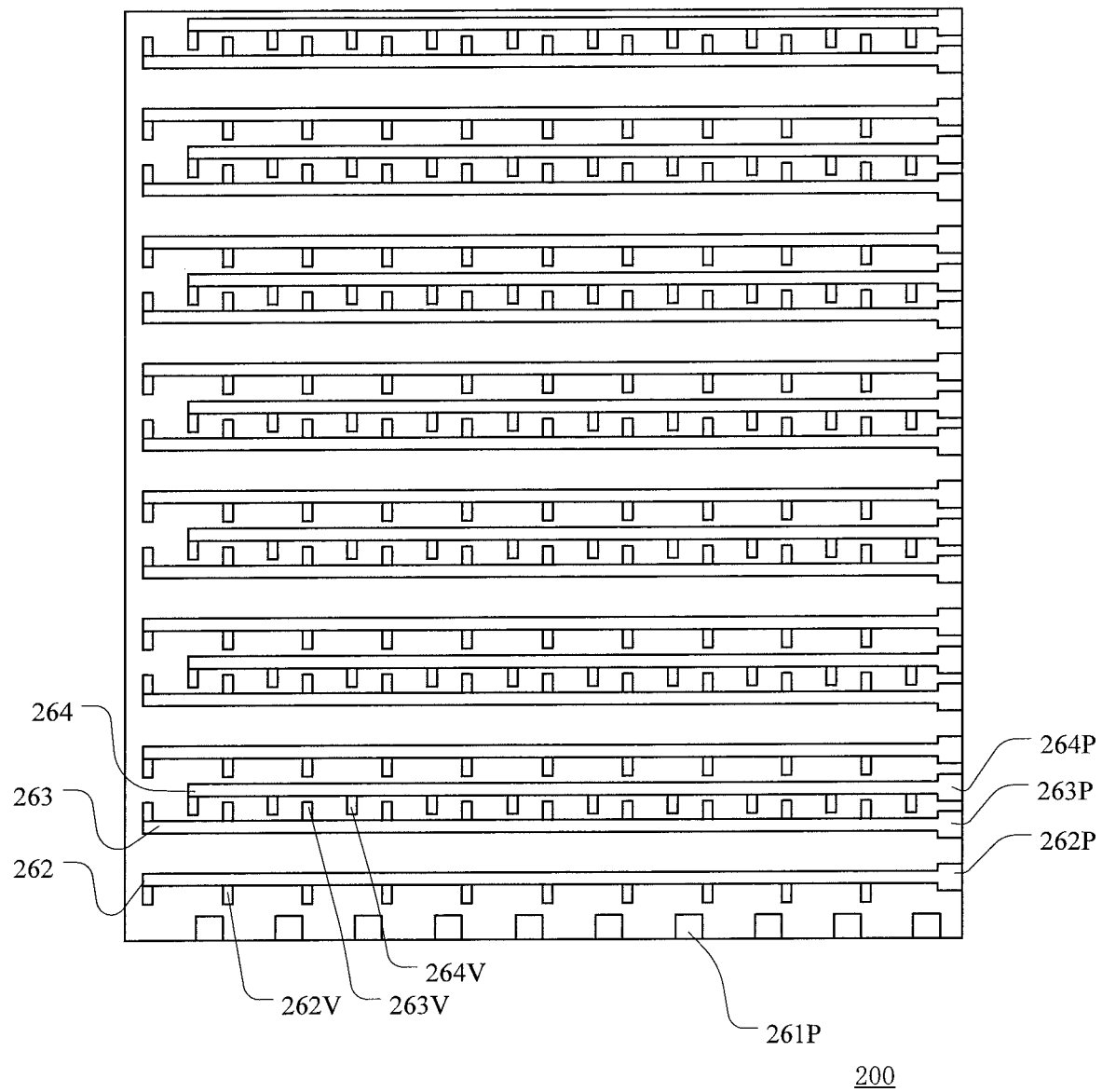

FIG. 2 is an exploded perspective diagram of an LED package according to an embodiment of the present disclosure. FIGS. 3a and 3b are a top diagram and a bottom diagram of an LED package according to an embodiment of the present disclosure. An LED package 200 includes a lead frame, a plurality of pixel units arranged in 9*6 array and an encapsulating composition 250. Each pixel unit includes LED elements 220 to 240 mounted on the lead frame, the encapsulating composition 250 is a type of light-transmissive material, covering the surface of the lead frame. In FIGs, for the sake of clarity, the encapsulating composition 250 of the package 200 is separated from the other portions.

The lead frame is a double-layer circuit board manufactured by a PCB manufacturing process, including a PCB substrate 201, a plurality of wires 261 to 264, a plurality of bonding pads 261P to 264P, a plurality of vias 261V to 264V, and a plurality of pins 211 to 214. The plurality of pins 211 to 214 are provided on a same side of the PCB substrate 201, and are opposite to the plurality of bonding pads 261P to 264P on the other side of the PCB substrate 201. The pin 211 can also be used as a pin.

The frame lead is manufactured by a PCB manufacturing process, for example, pattern transfer and etching is applied to define the pins and the shape of the pins. The plurality of pins may further include additional plating layer to improve the electrical conductivity, for example, conductive plating layers are formed on the plurality of pins 211 to 214 by using materials selected from the group consisting of gold, silver and other precious metals.

The LED elements 220 to 240 are light emitting elements respectively showing one of red, green and blue colors. The LED elements 220 to 240 respectively include an anode and a cathode, and includes a PN junction inside. When a forward voltage is applied between the anode and the cathode of an LED element, the LED element is turned on, electrons are injected from N-type region into P-type region, and holes enter the N-type region from the P-type region, thereby using the combination of the minority carriers and the majority carriers to emit light. The LED elements 220 to 240 may be fixed on a bearing region of the lead frame by using an adhesive.

The encapsulating composition 250 allows the light generated by the LED elements 220 to 240 to transmit and the material of the encapsulating composition 250 is, for example, an epoxy resin.

According to the characteristics of the internal structure, the anodes and cathodes of the LED elements 220 to 240 may be formed on a same surface or opposite surfaces of the LED elements. For example, FIG. 2 illustrates the LED element 220 which has a vertical structure and shows red color, the anode and the cathode (not shown) are respectively formed on the opposite surfaces. In the prior art, the anode of the LED element 220 is provided on an upper surface of the LED element 220. The LED elements 230 and 240 both have a planar structure and respectively show blue and green colors. For example, the anode and the cathode of the LED element 230 are provided on the upper surface of the LED element 230 and are spaced apart from each other.

The LED element 220 is fixed on the pin 211 by using a conductive adhesive (e.g., silver glue) and meanwhile the cathode of the LED element 220 is electrically connected to the pin 211. The cathodes of the LED elements 230 and 240 are electrically connected with the pins 211 by using bonding wires, respectively, to realize a common cathode connection. Further, the anodes of the LED elements 220 and 240 are electrically connected with the pins 212 to 214 by using bonding wires, respectively. This embodiment describes that the cathodes of the LED elements 220 to 240 of each pixel unit in the LED package 200 are connected to a common pin 211 to form a common cathode structure. In an alternative embodiment, the anodes of the LED elements 220 to 240 of each pixel unit in the LED package 200 are connected to a common pin 211 and the cathodes of the LED 220 to 240 are connected to the pins 212 to 214, to form a common anode structure.

The LED package include a pixel array consisting of 9*6 pixel units, and the plurality of wires 261 to 264 are used to provide interconnection between the different pixel units in the LED package 200. As shown in FIG. 3, the wire 261 is provided on a first surface of the PCB substrate 201 the same as the pixel units, which connects the pins 211 of the pixel units in a same column of the pixel array with each other and further connects to the bonding pad 261P on a second surface of the PCB substrate 201 through the vias 261V. In this embodiment, the number of the wire 261 and vias 261V and bonding pad 261P is 9, which corresponds to the number of columns in the pixel array.

The pins 220 and 240 of each pixel unit in the LED package 200 are connected to the wires 262 to 264 on the second surface of the PCB substrate 201 through corresponding vias 262V to 263V, respectively. The wire 262 is used for connecting the pins 212 of the pixel units in a same row in the pixel array with each other and further connecting to the bonding pad 262P, the wire 263 is used for connecting the pins 212 of the pixel units in a same row in the pixel array with each other and further connecting to the bonding pad 263P and the wire 264 is used for connecting the pins 214 of the pixel units in a same row in the pixel array with each other and further connecting to the bonding pad 264P. In this embodiment, the number of the wire 262, vias 262V and bonding pad 262P is 6, the number of the wire 263, vias 263V and bonding pad 263P is 6, and the number of the wire 264, the vias 264V and the bonding pads 264P is 6, which correspond to the number of column in the pixel array.

The bonding pads 261P to 264P are used for electrical connection with external circuits. For example, the bonding pad 261P to 264P of the LED package may be fixed on the printed circuit board by using solder and further connect to a display driver circuit via the printed circuit board.

In operation, the display drive circuit provides driving signals to the LED elements 220 to 240 of the LED package 200, and by controlling the luminance of various LED elements, light emission with desired colors and luminance is generated. After the LED package is used as a pixel unit to form an LED display screen, the LED display screen can be controlled by a driver circuit to display images.

In the above LED package, the LED elements 220 to 240 are mounted on the lead frame, and then covered by the encapsulating composition. Each LED package includes a plurality of pixel units and implements interconnection by four sets of wires, and then the four sets of wires are connected to the corresponding bonding pads. When an LED module is formed, a plurality of LED packages are welded to a printed circuit board (PCB). For example, in order to form an LED module including 9*6 pixel units, the total number of the bonding pads 261P to 264P is 9+6*3, i.e., 27. The LED package 200 improves the integration level of the pixel units and reduces the total number of the bonding pads. When an LED module is formed, the work of placing and welding the LED package is reduced, so that the production efficiency is improved and the manufacturing cost is reduced. Because the LED package requires forming 27 bonding pads at the area of the 9*6 pixel units, large-size bonding pads can be used to reduce the difficulty in welding the bonding pads and thus, the reliability of the LED module is improved.

Figure 4A:
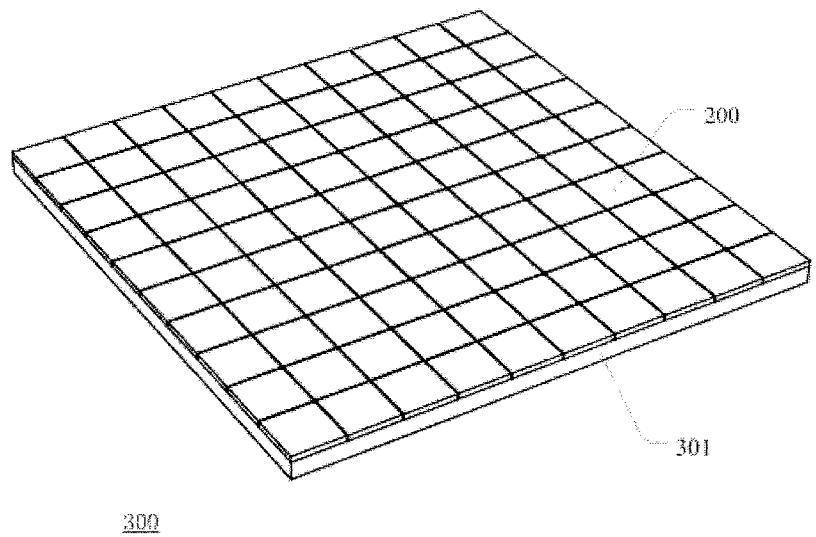
FIGS. 4a and 4b are perspective diagrams of an LED package viewed from different angles according to an embodiment of the present disclosure.
Figure 4B:
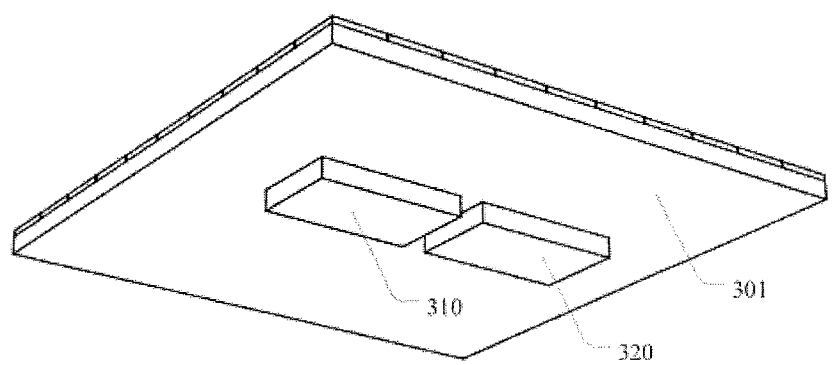

FIGS. 4a and 4b are perspective diagrams of an LED package viewed from different angles according to an embodiment of the present disclosure. An LED module includes a PCB substrate 301, a plurality of LED packages 200 (as shown in FIG. 2) mounted on a first surface of the PCB substrate 301, a display driver circuit 310 mounted on a second surface of the PCB substrate 301 and a power supply circuit 320. As an example, the LED module 300 in FIGs includes an array consisting of 10*10 LED packages 200.

It can be understood that the plurality of LED packages 200 can be welded to the PCB substrate 301, wires (not shown) can be formed on the PCB substrate 301, and further the LED packages are connected with the display driver circuit 310 and the power supply circuit 320.

In operation, the display drive circuit 310 provides driving signals to the LED elements 220 to 240 of the LED packages 200, and by controlling the luminance of each LED element, light emission with desired colors and luminance can be generated. After the LED package is used as a pixel unit to form an LED display screen, the LED display screen can be controlled by a driver circuit to display images.

Figure 5:
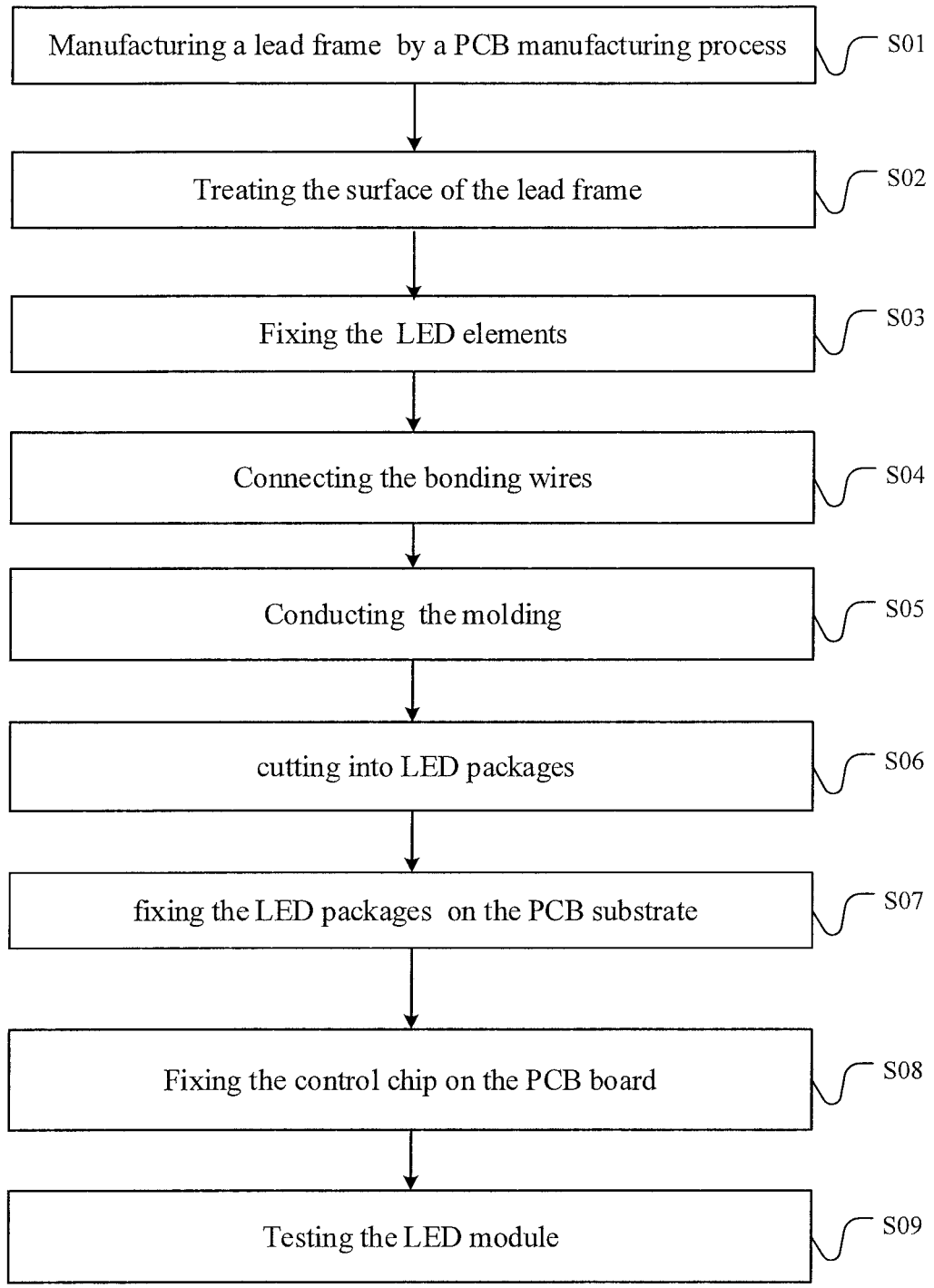
FIG. 5 is a flow diagram of a method for manufacturing an LED module according to an embodiment of the present disclosure.

FIG. 5 is a flow diagram of a method for manufacturing an LED module according to an embodiment of the present disclosure.

At step S01, a lead frame is manufactured by a PCB manufacturing process. For example, a plurality of vias connecting a first surface to a second surface of the PCB substrate is formed by punching at the positions of the plurality of pins on the PCB substrate, then a mask is used for defining the shape of the pins and a first set of wires on the first surface of the PCB substrate, the shape of a second set of wires to a fourth set of wires on the second surface of the PCB substrate, and the shape of the first to fourth sets of bonding pads. The plurality of pins electrically connects with the corresponding bonding pads on the second surface of the PCB substrate through the first to fourth sets of wires and the plurality of vias, thereby forming the main frame structure of the lead frame.

At step S02, preferably, the surface of the lead frame is treated. The step includes for example, cleaning the surface and forming a plating metal layer thereon. A conductive plating layer is formed on the surface of the pins of the lead frame, which is made of materials selected from the group consisting of gold, silver and other precious metals. The conductive plating layer can improve the conductivity and the solder wettability.

At step S03, the plurality of LED elements showing red, green and blue colors are fixed on the pins of the lead frame by an adhesive. The LED element showing red color has a vertical structure and its anode and cathode are respectively provided on the opposite surfaces of a LED element, so that a conductive adhesive (for example silver glue) can be used to bond the red LED element to the pins of the lead frame for providing electrical connection between them.

At step S04, the electrodes of the LED elements are electrically connected with the plurality of pins by using bonding wires. The step includes for example, placing solder on the interconnection region of the pins of the lead frame, reflowing the solder by heating, and welding the bonding wires to the interconnection region of the pins.

At step S05, the lead frame having been fixed is placed into a mold, and an encapsulating composition such as resin is injected into the mold and the molding is conducted. The encapsulating composition may be a type of light-transmissive material, which allows the light generated by the LED elements to be transmitted. The encapsulating material may also be used to form a light emitting port, for example, a cone-shaped light emitting port is formed in the resin encapsulating composition, and the respective light emitting sides of the three LED elements are exposed at the bottom of the light emitting port.

At step S06, the component formed by the above steps are separated by cutting into LED packages that respectively includes a plurality of pixel units which interconnects to each other through the first set of wires to the fourth set of wires. In each LED package, the plurality of pixel units are arranged in a pixel array. Each pixel unit includes three LED elements. The plurality of pixel units in the LED package interconnects to each other through the first set of wires to the fourth set of wires, and thus, the number of the bonding pads in the LED package is decreased.

At step S07, the plurality of LED packages are fixed on the PCB substrate. The PCB substrate includes a plurality of bonding pads and a plurality of wires. For example, the bonding pads of the plurality of LED packages and the bonding pad of the PCB substrate are fixed together through solder, to realize the electrical connection between them.

At step S08, the control chip is fixed on the PCB board. The control chip for example includes the display driver circuit 310 and the power supply circuit 320. The bonding pad of the control chip and the bonding pad of the PCB substrate are fixed together through solder, to realize the electrical connection between them. The wires on the PCB board are used for providing the electrical connection between the control chip and the LED packages. At the step, the LED module including a plurality of pixel units and additional circuits is formed.

At step S09, the LED module is tested to determine whether the pixel units in the LED module can illuminate normally. The tested LED modules are provided to the customers as qualified products.

The above embodiment describes a method which directly forms the main frame structure of the lead frame by using a PCB manufacturing process. In an alternative embodiment, the main frame of the lead frame is formed by a punching method of machining process, where a mold is used for limiting the shape of the pins, and the main frame can also include additional support frame to temporarily support the pins. After the completion of the package, a punching machine is used to cut off the connection between the lead frame and the support frame, to make the LED package to be a separate component, thereby forming the main frame structure of the lead frame.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. Accordingly, the protection scope of the invention is only defined by attached claims.

The invention claimed is:

1. An LED package, comprising:
   a lead frame comprising an insulating substrate, and a plurality of first pins to a plurality of fourth pins, a plurality of first bonding pads to a plurality of fourth bonding pads and a plurality of first wires to a plurality of fourth wires formed on said insulating substrate;
   a plurality of pixel units, each of which includes a first LED element, a second LED element and a third LED element; and
   an encapsulating composition covering said lead frame and allowing light to transmit,
   wherein, in each one of said plurality of pixel units, said first LED element, said second LED element and said third LED element respectively have a first electrode being fixed on a common one of said plurality of first pins,
   wherein, in each one of said plurality of pixel units, a second electrode of said first LED element, a second electrode of said second LED element and a second electrode of said third LED element are respectively fixed on a corresponding one of said plurality of second pins, a corresponding one of said plurality of third pins and a corresponding one of said plurality of fourth pins,
   wherein each of said plurality of first wires is used for connecting corresponding ones of said plurality of first pins to a corresponding one of said plurality of first bonding pads, each of said plurality of second wires is used for connecting corresponding ones of said plurality of second pins to a corresponding one of said plurality of second bonding pads, each of said plurality of third wires is used for connecting corresponding ones of said plurality of third pins to a corresponding one of said plurality of third bonding pads, each of said plurality of fourth wires is used for connecting corresponding ones of said plurality of fourth pins to a corresponding one of said plurality of fourth bonding pads.

2. The LED package according to claim 1, wherein said insulating substrate comprises a first surface and a second surface being opposed to each other, said plurality of first pins to said plurality of fourth pins and said plurality of first wires are provided on said first surface, said plurality of said first bonding pads to said plurality of fourth bonding pads and said plurality of second wires to said plurality of fourth wires are provided on said second surface, and said LED package further comprises a plurality of vias passing through said insulating substrate,
    wherein each of said plurality of vias is configured to provide an electrical connection of said first surface to said second surface.

3. The LED package according to claim 1, wherein said plurality of pixel units are arranged in a pixel array,
    wherein each one of said plurality of first wires are used for interconnecting said first pins connected to said pixel units which are arranged in a corresponding column of said pixel array,
    wherein each one of said plurality of second wires are used for interconnecting said second pins connected to said pixel units which are arranged in a corresponding row of said pixel array,
    wherein each one of said plurality of third wires are used for interconnecting said third pins connected to said pixel units which are arranged in a corresponding row of said pixel array,
    wherein each one of said plurality of fourth wires are used for interconnecting said fourth pins connected to said pixel units which are arranged in a corresponding row of said pixel array.

4. The LED package according to claim 1, wherein said first electrode is one of anode and cathode electrodes, and said second electrode is said other of anode and cathode electrodes.

5. The LED package according to claim 1, wherein said first LED element, said second LED element and said third LED element show red, green and blue colors, respectively and their arrangement order is not limited.

6. The LED package according to claim 1, further comprising: a plurality of bonding wires, wherein said first LED element, said second LED element and said third LED element are connected to a corresponding one of said plurality of pins through corresponding ones of said plurality of bonding wires, respectively.

7. The LED package according to claim 1, wherein light emitting sides of said first LED element, said second LED element and said third LED element are covered by said encapsulating composition, respectively.

8. The LED package according to claim 1, wherein said first LED element is fixed on said pin by a conductive adhesive.

9. The LED package according to claim 1, wherein said lead frame is formed by a printed circuit board process, said insulating substrate is a substrate of said printed circuit board, said plurality of first pins to said plurality of fourth pins, said plurality of first bonding pads to said plurality of fourth bonding pads, and said plurality of first wires to said plurality of fourth wires are respectively formed by applying pattern transfer and etching method on a metal layer of said printed circuit board.

10. An LED module, comprising:
    a printed circuit board comprising a second insulating substrate and a plurality of fifth bonding pads and a plurality of fifth wires on said second insulating substrate;
    a control chip being fixed and electrically connected with a corresponding bonding pad of said plurality of fifth bonding pads; and
    at least one LED package being fixed and electrically connected with a corresponding bonding pad of said plurality of fifth bonding pads,
    wherein said plurality of fifth wires are used for electrically connecting said control chip with said at least one LED package,
    a respective one of said at least of one LED package comprises:
        a lead frame comprising a first insulating substrate, and a plurality of first pins to a plurality of fourth pins, a plurality of first bonding pads to a plurality of fourth bonding pads, and a plurality of first wires to a plurality of fourth wires formed on said first insulating substrate;
        a plurality of pixel units, each of which comprises a first LED element, a second LED element and a third LED element; and
        an encapsulating composition covering said lead frame and allowing light to transmit,
    wherein, in each one of said plurality of pixel units, said first LED element, said second LED element and said third LED element respectively have a first electrode being fixed on a common one of said plurality of first pins,
    wherein, in each one of said plurality of pixel units, a second electrode of said first LED element, a second electrode of said second LED element and a second electrode of said third LED element are respectively fixed on a corresponding one of said plurality of second pins, a corresponding one of said plurality of third pins and a corresponding one of said plurality of fourth pins,
    wherein each of said plurality of first wires is used for connecting corresponding ones of said plurality of first pins to a corresponding one of said plurality of first bonding pads, each of said plurality of second wires is used for connecting corresponding ones of said plurality of second pins to a corresponding one of said plurality of second bonding pads, each of said plurality of third wires is used for connecting corresponding ones of said plurality of third pins to a corresponding one of said plurality of third bonding pads, each of said plurality of fourth wires is used for connecting corresponding ones of said plurality of fourth pins to a corresponding one of said plurality of fourth bonding pads.

11. The LED module according to claim 10, wherein said first insulating substrate comprises a first surface and a second surface being opposed to each other, said plurality of first pins to said plurality of fourth pins and said plurality of first wires are provided on said first surface, said plurality of said first bonding pads to said plurality of fourth bonding pads and said plurality of second wires to said plurality of fourth wires are provided on said second surface, said LED package further comprises a plurality of vias passing through said first insulating substrate,
    wherein each of said plurality of vias is configured to provide an electrical connection of said first surface to said second surface, and said plurality of first bonding pads to said plurality of fourth bonding pads are welded with corresponding ones of said plurality of first bonding pads.

12. The LED module according to claim 10, wherein said control chip comprises at least one selected from a group consisting of a display driver circuit and a power supply circuit.

13. A method for manufacturing an LED package, comprising:
    forming a lead frame for defining a plurality of first pins to a plurality of fourth pins, a plurality of first bonding pads to a fourth bonding pads, and a plurality of first wires to a fourth wires therein;

fixing a plurality of LED elements on said lead frame, wherein said plurality of LED elements constitute a plurality of pixel units, each pixel unit comprises a first LED element, a second LED element and a third LED element of said plurality of LED elements;

connecting said plurality of LED elements to said plurality of first pins to said plurality of fourth pins by using bonding wires;

conducting molding to form an encapsulating composition on said lead frame;

cutting and separating to form a LED package;

fixing a plurality of LED packages on a printed circuit board; and fixing a control chip on a printed circuit board, wherein, in each one of said pixel units, said first LED element, said second LED element and said third LED element respectively have a first electrode being fixed on a common one of said plurality of first pins, wherein, in each one of said plurality of pixel units, a second electrode of said first LED element, a second electrode of said second LED element and a second electrode of said third LED element are respectively fixed on a corresponding one of said plurality of second pins, a corresponding one of said plurality of third pins and a corresponding one of said plurality of said fourth pins, wherein each of said plurality of first wires is used for connecting corresponding ones of said plurality of first pins to a corresponding one of said plurality of first bonding pads, each of said plurality of second wires is used for connecting corresponding ones of said plurality of second pins to a corresponding one of said plurality of second bonding pads, each of said plurality of third wires is used for connecting corresponding ones of said plurality of third pins to a corresponding one of said plurality of third bonding pads, each of said plurality of fourth wires is used for connecting corresponding ones of said plurality of fourth pins to a corresponding one of said plurality of fourth bonding pads.

14. The method according to claim 13, wherein said step of forming a lead frame comprises:

forming a plurality of vias at positions of said plurality of first wires to said plurality of fourth wires on an insulating substrate of said printed circuit board by a PCB manufacturing process;

forming said plurality of first pins to said plurality of fourth pins and said plurality of first wires on a first surface of an insulating substrate of said printed circuit board; and forming said plurality of first bonding pads to said plurality of fourth bonding pads and said plurality of second wires to said plurality of fourth wires on a second surface of said insulating substrate of said printed circuit board.

15. The method according to claim 13, wherein said step of forming a lead frame comprises:

punching a sheet of metal material for defining the shape of said plurality of first pins to said plurality of fourth pins, said plurality of first bonding pads to said plurality of fourth bonding pads, and said plurality of first wires to said plurality of fourth wires; and punching and cutting to cut off connection between said lead frame and a support frame.

16. The method according to claim 13, wherein, between said step of forming a lead frame and said step of fixing a plurality of LED elements on said lead frame, further comprising: forming a metal plating layer on said plurality of first pins to said plurality of fourth pins, to improve electrical conductivity and solder wettability.

17. The method according to claim 13, wherein said step of fixing a plurality of LED elements on said lead frame comprises: the non-light-emitting sides of said plurality of LED elements are fixed on said plurality of first pins to said plurality of fourth pins in said lead frame.

18. The method according to claim 13, wherein said step of fixing a plurality of LED elements on said lead frame comprises: bonding at least a first LED element of said plurality of LED elements by conductive adhesive.

19. The method according to claim 13, wherein said step of form an encapsulating composition on said lead frame comprises: placing said lead frame in a mold, and injecting said encapsulating composition towards a surface of said lead frame from the light emitting sides of said plurality of LED elements.

* * * * *